United States Patent
Aldea et al.

(10) Patent No.: US 7,791,281 B2
(45) Date of Patent: *Sep. 7, 2010

(54) METHOD AND APPARATUS FOR STABILIZING A GLOW DISCHARGE PLASMA UNDER ATMOSPHERIC CONDITIONS

(75) Inventors: Eugen Aldea, Eindhoven (NL); Jan Bastiaan Bouwstra, Biltoven (NL); Mauritius Cornelius Maria Van De Sanden, Tilburg (NL); Hindrik Willem De Vries, Tilburg (NL)

(73) Assignee: Fuji Photo Film B.V., Tilburg (NL)

( * ) Notice: Subject to any disclaimer, the term of this patent is extended or adjusted under 35 U.S.C. 154(b) by 830 days.

This patent is subject to a terminal disclaimer.

(21) Appl. No.: 10/584,145

(22) PCT Filed: Dec. 22, 2004

(86) PCT No.: PCT/NL2004/000896

§ 371 (c)(1),
(2), (4) Date: Mar. 29, 2007

(87) PCT Pub. No.: WO2005/062337

PCT Pub. Date: Jul. 7, 2005

(65) Prior Publication Data

US 2007/0210721 A1 Sep. 13, 2007

(30) Foreign Application Priority Data

Dec. 22, 2003 (EP) ................................ 03079009

(51) Int. Cl.
*H05B 31/26* (2006.01)
(52) U.S. Cl. ............................ 315/111.21; 156/345.44; 156/345.47; 118/723 E; 219/121.48; 134/1.1

(58) Field of Classification Search ............ 315/111.21, 315/111.31, 111.41, 111.51, 111.81, 111.91; 219/121.36, 121.43, 121.48, 121.54, 121.57; 313/231.31, 231.41, 231.51; 156/345.43, 156/345.44, 345.47; 118/723 E; 204/164, 204/298.31, 192.1; 427/569; 134/1.1

See application file for complete search history.

(56) References Cited

U.S. PATENT DOCUMENTS

| | | | |
|---|---|---|---|
| 5,414,324 A | | 5/1995 | Roth et al. |
| 6,046,546 A | * | 4/2000 | Porter et al. ........... 315/111.51 |

(Continued)

OTHER PUBLICATIONS

International Search Report and Written Opinion mailed Apr. 15, 2005 in corresponding International Application Serial No. PCT/NL2004/000896 filed Dec. 22, 2004.

(Continued)

*Primary Examiner*—Douglas W Owens
*Assistant Examiner*—Ephrem Alemu
(74) *Attorney, Agent, or Firm*—Davidson Berquist Jackson & Gowdey LLP

(57) ABSTRACT

Method and apparatus for generating and sustaining a glow discharge plasma in a plasma discharge space comprising at least two spaced electrodes. The method and apparatus are arranged for performing the steps of introducing in the discharge space a gas or gas mixture under atmospheric pressure conditions, energizing the electrodes by applying an AC energizing voltage ($V_a$) to the electrodes, and controlling the energizing voltage ($V_a$) such that at plasma generation a sharp relative decrease of displacement current is provided.

24 Claims, 6 Drawing Sheets

U.S. PATENT DOCUMENTS 6,147,452 A * 11/2000 Kunhardt et al. ............ 313/582
6,299,948 B1 * 10/2001 Gherardi et al. ............. 427/569

OTHER PUBLICATIONS

E. Aldea et al., "Generation of a Stable Atmospheric Glow in a DBD Configuration," International Symposium on Plasma Chemistry Proceedings, Jun. 22, 2003, XP009034055, pp. 1-6.

P. Bletzinger and B. N. Ganguly, "The effect of displacement current on fast-pulsed dielectric barrier discharges," Journal of Physics D: Applied Physics, Institute of Physics Publishing, Ltd., UK, vol. 36, No. 13, Jun. 18, 2003, pp. 1550-1552, XP002310826, ISSN: 0022-3727.

T. Yokohama et al., "The mechanism of the stabilisation of glow plasma at atmospheric pressure," Journal of Physics D: Applied Physics, Institute of Physics Publishing, Ltd., UK, vol. 23, No. 8, 1990, pp. 1125-1128, XP002322399, ISSN: 0022-3727.

* cited by examiner

METHOD AND APPARATUS FOR STABILIZING A GLOW DISCHARGE PLASMA UNDER ATMOSPHERIC CONDITIONS

FIELD OF THE INVENTION

The present invention relates generally to a method and an apparatus for generating a glow discharge plasma under atmospheric pressure conditions and, more specifically, to a method and an apparatus for stabilizing such a glow discharge plasma.

BACKGROUND OF THE INVENTION

Atmospheric Pressure Glow (APG) discharge is used in practice, among others, for non-destructive material surface modification. Glow discharge plasmas are relatively low power density plasmas, typically generated under atmospheric pressure conditions or partial vacuum environments.

Most commonly, the plasma is generated in a plasma chamber or plasma discharge space between two oppositely arranged parallel plate electrodes. However, the plasma may also be generated using other electrode configurations such as, for example, adjacently arranged electrodes. The plasma is generated in a gas or a gas mixture by energizing the electrodes from AC power supply means.

It has been observed that a stable and uniform plasma can be generated in, for example, a pure Helium or a pure Nitrogen gas. However, as soon as impurities or other gasses or chemical compositions at ppm level are present in the gas, the stability of the plasma will decrease significantly. Typical examples of stability destroying components are $O_2$, NO, $CO_2$, etc . . .

Instabilities in the plasma will either develop in a high current density plasma or will extinguish the plasma locally. With a large density of species and a high frequency of collisions in the plasma, an APG shows a fast positive feedback. That is, a random local increase of the ionization of the plasma will exponentially increase. Accordingly, an instability will develop either in a high current density plasma or will extinguish locally the plasma. This phenomenon of exponential increase of the plasma current is known as glow to arc transition. As a result, current arcing occurs and the glow discharge plasma can not be maintained. Instead, a combination of filamentary and glow discharge is generated.

Filamentary discharge between parallel plate electrodes in air under atmospheric pressure has been used to generate ozone in large quantities. However, filamentary discharge is of limited use for surface treatment of materials, since the plasma filaments tend to puncture or treat the surface unevenly and are associated with relatively high plasma current densities.

SUMMARY OF THE INVENTION

It is an object of the present invention to provide a novel and improved method and apparatus for preventing glow to arc transition in an atmospheric glow discharge plasma.

This and other objects and features are achieved, according to the present invention, by a method for controlling a glow discharge plasma in a gas or gas mixture under atmospheric conditions, in a plasma discharge space comprising at least two spaced electrodes, wherein at least one plasma pulse is generated by applying an AC plasma energizing voltage to said electrodes causing a plasma current and a displacement current, said at least one plasma pulse comprising an absolute pulse maximum, characterized in that, said method comprises the step of controlling said energizing voltage such that a relative decrease of said displacement current is provided before said pulse maximum.

As we are dealing with an alternating energizing voltage, the sign of the amplitude thereof and also of the displacement current will change from positive to negative. In the case of the positive half cycle or period of the energizing voltage, a decrease of the displacement current will reduce the probability of filament formation. A displacement current having a negative value will not allow the formation of any filaments. Consequently one can prevent the generation of the filaments by sharply decreasing the displacement current during the plasma generation before the pulse maximum, in accordance with the present invention.

In the case of the negative half cycle of the energizing voltage a similar explanation, but with opposite signs as mentioned above, is valid.

For clarity purposes, the term "sharp relative decrease" of the displacement current has to be construed in that the word "sharp" indicates that there is a rapid change of the displacement current, while "relative decrease" means that the sign of the changes can be positive as well as negative. In case the energizing voltage is in the positive half cycle, the "sharp relative decrease" of the displacement current means that the displacement current decreases rapidly going to zero or even a negative value. If the energizing voltage is in the negative half cycle, the "sharp relative decrease" of the displacement current means that the displacement current increases rapidly going to zero or even a positive value.

Unless it is mentioned otherwise below, the description of the processes and/or measures to stabilize the glow plasma in accordance with the invention is mainly provided for the positive half cycle of the displacement current. An identical description for the negative half cycle of the displacement current can be equally provided by changing the sign to the opposite. Hence for the negative half cycle, the prevention of filament generation can be achieved, in accordance with the present invention, by relatively sharply decreasing the displacement current (corresponding to an absolute increase of the displacement current) during the plasma generation before the relative pulse maximum (corresponding to the absolute minimum) of said plasma pulse during the negative half cycle. For clarity purposes, hereinbelow the invention will be described in relation to a positive half cycle only, and similar measures during the negative half cycle with similar effect are to be assumed, unless stated otherwise.

In a preferred embodiment of the invention, at least one of the electrodes is covered by a dielectric material.

The method according to the present invention is based on the insight that in a dielectric barrier discharge the density of the filamentary discharges can be controlled by the displacement current. In a filamentary discharge, a large quantity of charge is generated and accumulates on the dielectric which covers the or each electrode. This results in a substantial drop of the gas voltage in the area where the filament was generated. A new filament can not be generated in the neighborhood of this area until the voltage between the electrodes, and thereby the gas voltage, is increased. Thus, the displacement current controls the rate of voltage variation and is proportional with the density of filamentary discharges per unit of time.

In order to create a homogenous glow discharge, it has been found that the relative decrease of the displacement current has to take place within a time interval, which time interval is of an order of a microsecond, preferably fractions of a microsecond. The time interval may for example be within a range of 0.05 μs. and 10 μs. Within this short time interval, the relative decrease of the displacement current is preferably being at least 100%.

Additionally, good results have been achieved in an embodiment of the invention wherein the relative decrease of the displacement current resulted in a negative value for the displacement current.

It has also been found that when a mixture of glow and filaments is formed, the stability of the glow plasma will not be significantly affected by the decrease of the displacement current.

This phenomenon might be caused by the fact that the current density in the glow plasma is three to four orders of a magnitude smaller than in a filament (streamer). Hence, the energizing voltage drop due to the generation of glow plasma will be three to four orders of magnitude slower than in the filament case. Another factor that may explain the finding is the homogeneity of the glow plasma, where one does not need to re-ignite the plasma periodically as in the case of filaments. Consequently, the sharp decrease of the displacement current during the plasma generation will not affect the glow variety, but will only eliminate the risk of filament formation, as required.

The present invention is therefore most suitable for stabilizing an unstable plasma, which instability may be caused by the properties of the dielectric surface, the use of a low frequency, electron negative gas, and other factors. The method according to the present invention is also very suitable for stabilizing a plasma discharge comprising a mixture of filaments and glow, and for keeping the glow plasma stable by preventing the transition from the glow to the filamentary state.

The gas voltage variation is given by:

$$dV_{gas}/dt = dV_a/dt - I_p/C_{dielectric} \quad (1)$$

wherein:
$V_a$=energizing or applied voltage
$V_{gas}$=gas voltage
$I_p$=plasma current
$C_{dielectric}$=capacitance of the dielectric barriers and the first derivative of the energizing voltage or applied voltage over time is given by:

$$dV_a/dt = I_d/C \quad (2)$$

wherein:
$I_d$=displacement current
C=total capacitance of the dielectric barriers and discharge gap The second derivative of the energizing or applied voltage over time is in fact proportional to the first derivative of the displacement current over time and is given by:

$$d^2V_a/dt^2 = 1/C \cdot dI_d/dt \quad (3)$$

and the total current measured in the current path of the plasma electrode, $I_t$, is given by:

$$I_t = I_p + I_d \quad (4)$$

and:

$$V_a = V_{gas} + V_{dielectric} \quad (5)$$

wherein:
$V_{dielectric}$=voltage across the dielectric barriers.

To avoid any instability, the gas voltage variation has to be below zero or close to zero. Thus the maximum value of the displacement current $I_d^{max}$ has to be smaller than:

$$I_d^{max} \leq C \cdot I_p^{max}/C_{dielectric} \quad (6)$$

wherein:
$I_p^{max}$=maximum value of the plasma current.

It will be appreciated that a small displacement current close to zero or below zero will always be below the critical stability limit, whatever the maximum plasma current density or stray or dielectric capacitance will be. Thus, by using the embodiments described in the present invention the glow will be always in a safe region wherein the glow to arc transition risk is small.

The method according to the present invention is also based on the insight that the adverse effects of filamentary discharge in an APG plasma for surface treatment can be reduced by enhancing or stimulating secondary electron emission from the surface by selecting a suitable material with a relatively high secondary electron emission.

In the case that there is a tendency of a generation of local high current density instabilities (plasma filaments), the rate of filament formation is determined by the displacement current or by the time derivative of the energizing voltage. Accordingly, by controlling the second derivative over time of the energizing voltage an effective plasma stability control is achieved.

Based on the above, in a further embodiment of the invention, the displacement current is provided as a first derivative over time of an absolute value of the energizing voltage and wherein the energizing voltage is controlled in a manner such that at plasma generation the first derivative over time of the absolute value of the energizing voltage is sharply decreased.

In accordance with a preferred embodiment of the invention, at plasma generation in the positive half cycle of the energizing voltage, the displacement current is relatively decreased in fractions of a microsecond. Hence, by suddenly decreasing the first derivative over time of the absolute value of the energizing voltage, the required sharp decrease in the displacement current can be obtained both in the positive as well as the negative half cycle of the energizing voltage.

That is, with the method according to the present invention, steps are taken from the ignition of a plasma countering instabilities to occur in the plasma, that is in advance. This, different from prior art methods for stabilizing plasma currents which respond to an already occurred plasma instability, i.e. a filamentary current or streamer, as disclosed by U.S. Pat. No. 5,414,324. For protecting the substrate or surface to be treated against sparks, i.e. current arcing in the plasma, an electrically conductive grid is provided between the electrodes. This grid is connected by an inductor having a large inductance. The grid and the inductor operate as a collector of current sparks, which already have occurred in the plasma, and are not operative for preventing the occurrence of such sparks. That is, a spark is already present when the inductor starts to react by decreasing the energizing voltage of the plasma. Note that operation of the grid and the inductor for reducing the energizing voltage is not functional during plasma breakdown. When the plasma develops explosively at breakdown, decrease of the energizing or excitation voltage is not a guarantee that the plasma current will start to decrease. Near breakdown of the plasma, the plasma has a negative resistance, such that the current in fact will increase faster if the voltage is decreased.

In a yet further embodiment of the method according to the invention, the energizing voltage is controlled in a manner such that at plasma generation the second derivative of the energizing voltage over time is proportional and of the opposite sign to the first derivative over time of the plasma current. The stabilization of the displacement current increases significantly the uniformity of the plasma distribution over the surface to be treated, as can be seen in FIG. 5.

In a yet further embodiment of the method according to the invention, the dielectric material covering at least one of the electrodes should have a secondary electron emission between 0.01 and 1 and preferably between 0.1 and 1.

If the secondary electron emission is smaller than 0.01, a large volume ionization coefficient will be required in order to keep a self sustained discharge. As a result of such a large ionization coefficient, the discharge will develop into a streamer-like discharge. On the other hand, a stable plasma can not be generated at a secondary electron emission higher than 1.

The invention further provides a method for generating plasma, wherein the energizing voltage is controlled in a manner such. that the plasma is operated at a voltage just above the breakdown voltage. Preferably, the voltage is a few percent higher than the minimum voltage needed for maintaining the plasma.

The invention provides also an apparatus for controlling a glow discharge plasma in a discharge space having at least two spaced electrodes, means for introducing in said discharge space a gas or gas mixture under atmospheric conditions, a power supply for energizing said electrodes by applying an AC plasma energizing voltage to said electrodes for generating at least one plasma pulse and causing a plasma current and a displacement current, said at least one plasma pulse comprising an absolute pulse maximum, and means for controlling said plasma, characterized in that, said means for controlling said plasma are arranged for controlling said energizing voltage such that a relative decrease of said displacement current is provided before said pulse maximum. At least one of the electrodes is preferably covered by a dielectric material.

In a yet further embodiment of the apparatus according to the invention, the stabilization means are arranged for controlling the energizing voltage in a manner such that at plasma generation the relative decrease of the displacement current is provided in fractions of a microsecond. The stabilization means, comprise pulse generator means providing voltage pulses superimposed at the energizing voltage at the electrodes. The pulse generator means are controlled such to that during plasma generation before the pulse maximum, the second derivate over time of the absolute value of the energizing voltage has a negative value, i.e. below zero, preferably a substantially negative value.

In another embodiment of the invention, the stabilization means are arranged for controlling the energizing voltage in a manner such that at plasma generation the second derivate of the energizing voltage over time is proportional and of the opposite sign to the first derivative over time of the plasma current.

A suitable pulse generator, for use with the present invention comprises, in an embodiment thereof, a power amplifier, having input or control terminals which are connected to means for sensing plasma current and/or means for providing the first derivative over time of the displacement current, and wherein the output terminals of the amplifier are connected in series with the power supply means and the electrodes for superimposing a voltage pulse or voltage pulses at the plasma energizing voltage.

Means for generating the first derivative over time of the displacement current which is able to oppose the plasma current variation can be provided by properly designed inductor means, such as a current choke coil incorporated in the current path of the plasma discharge space.

In an alternative embodiment of the apparatus according to the invention, the stabilization means comprise inductor means, such as at least one choke coil. At least one of the electrodes and the inductor means are connected in series to the power supply means.

During breakdown of the plasma, the plasma current increases very rapidly, as a result of which a large voltage drop occurs over the inductor, which is proportional to the rate of change of the current and the inductance of the inductor means. The energizing voltage applied to the plasma will show a drop having a steep slope. By a proper design of the inductor means, the second derivative over time of the absolute value of the energizing voltage will be negative during breakdown of the plasma, i.e. at the rising edge of the plasma current.

In a yet further embodiment of the invention the apparatus according to the invention comprises stabilization means having electronic inductor circuitry.

From experimentally obtained data, it has been shown that the method and apparatus according to the present invention results in a very stable plasma from breakdown thereof, for a variety of different supply gases, excitation conditions, electrode designs and electrode spacing, such as a distance from between 0.01 mm to 3 cm.

Gasses for generating the plasma can be selected from a group comprising Helium, Argon, Nitrogen, Air, Oxygen, Carbon Dioxide, Ammonia and a mixture comprising any of the gasses of the group.

In a preferred embodiment of the invention, the gas is a mixture of noble gas such as helium or argon and a chemically active gas such as air, oxygen and carbon dioxide. The gasses may also comprise of specific chemical compositions which are usually involved in the chemical vapor deposition processes such as $SiH_4$, hydrocarbons, organosilicons such as Tetraethyl Orthosilicate (TEOS).

The apparatus and method according to the present invention can be used, in practice, for a wide variety of applications such as, but not limited to, a device for plasma surface treatment of a substrate, such as surface activation processes, which substrate can be glass, polymer, metal, etc., and for the generation of hydrophilic or hydrophobic surfaces; a plasma device for a chemical vapor deposition process; a plasma device for decomposition of gasses containing volatile organic compounds; a plasma device for removing toxical compounds from the gas phase; a plasma device for surface cleaning purposes such as in the sterilization or dry cleaning processes.

The above-mentioned and other features and advantages of the invention are illustrated in the following description with reference to the enclosed drawings.

DETAILED DESCRIPTION OF THE DRAWINGS

Figure 1:
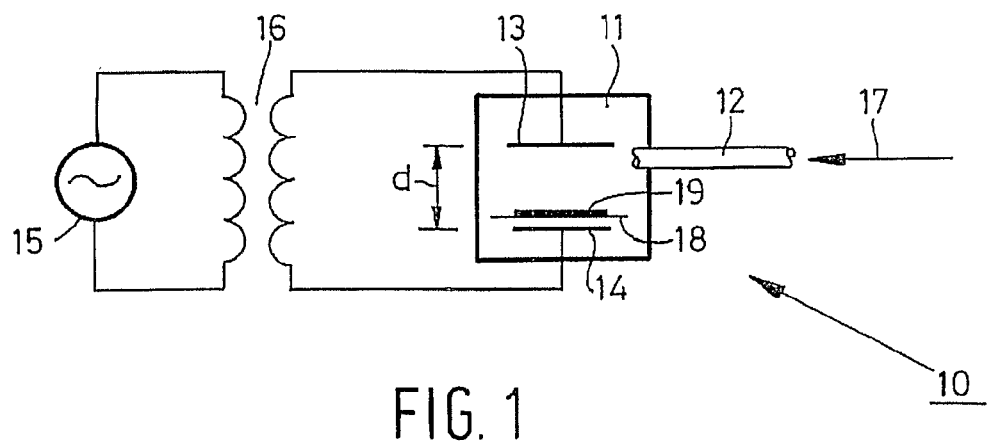
FIG. 1 shows, in a very schematic manner, a commonly known APG plasma device.

Without the intention of limitation, the present invention will now be disclosed in more detail with respect to the attached drawings. In the drawings, like parts are designated by like reference numerals.

Figure 9:
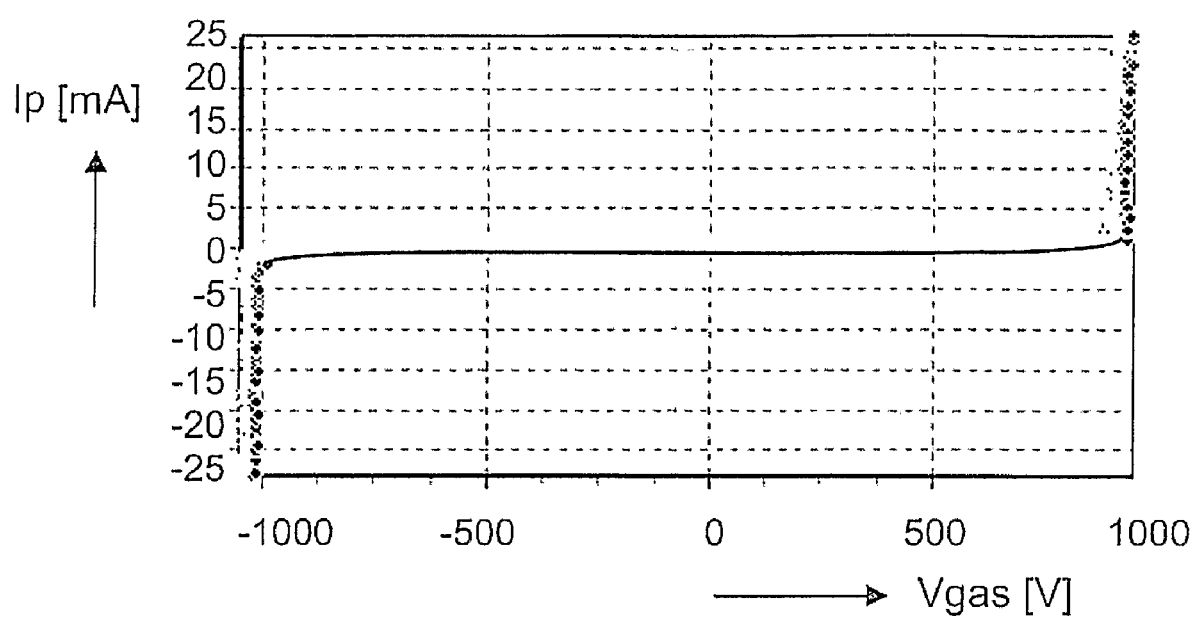
FIG. 9 shows a typical I-V characteristic of an unstable plasma discharge, calculated from measured values.

FIG. 9 shows a typical plasma current, $I_p$, vs. gas voltage, $V_{gas}$, characteristic of an unstable plasma. The gas voltage $V_{gas}$ is depicted in Volts along the horizontal axis and is calculated by subtracting from the applied or energizing voltage $V_a$ the voltage drop $V_{dielectric}$ across the dielectric barriers. The plasma current $I_p$ plotted in mA along the vertical axis is calculated by subtracting the displacement current $I_d$ from the total current $I_t$ running through the system. The current and voltage values provided in FIG. 9 are for reference purposes only. The plasma is characterized by a very low dynamic resistance, thus being very sensitive to any perturbation.

As can be seen from FIG. 9, an increase of the gas voltage $V_{gas}$ to values just above the breakdown voltage (i.e. near ±1000 Volt in this example) will trigger a large plasma current variation $I_p$ and most probably a transition from glow to arc or another filamentary state.

FIG. 1 shows a very schematic embodiment of a commonly known Atmospheric Pressure Glow (APG) plasma apparatus or device 10. The apparatus 10 comprises a plasma chamber or plasma discharge space 11 and means 12 for supplying a gas or a gas mixture under atmospheric pressure conditions in the discharge space 11, indicated by arrow 17. For producing and sustaining a glow discharge plasma in the plasma discharge space 11, for treating a surface 19 of a body 18, at least two oppositely spaced electrodes 13 and 14, in the discharge space 11 connect to AC power supply means 15, preferably AC power means, via an intermediate transformer stage 16. The frequency of said AC power supply means is selected between 10 kHz and 50 MHz.

Although two oppositely spaced electrodes 13 and 14 at a distance d are shown, the apparatus 10 may comprise a plurality of electrodes, which not necessarily have to be arranged oppositely. The electrodes 13, 14 may be positioned adjacently, for example. At least one of the electrodes is preferably covered by dielectric material having a secondary electron emission between 0.01 and 1.

In accordance with the present invention, adverse effects of filamentary discharge in an APG plasma are reduced by controlling the energizing voltage $V_a$ such that at plasma generation a sharp relative decrease of the displacement current is provided, which is comes down to the case wherein the second derivate over time of the absolute value of the energizing voltage has a value less than zero, and preferably having an as large as possible negative value.

Figure 2:
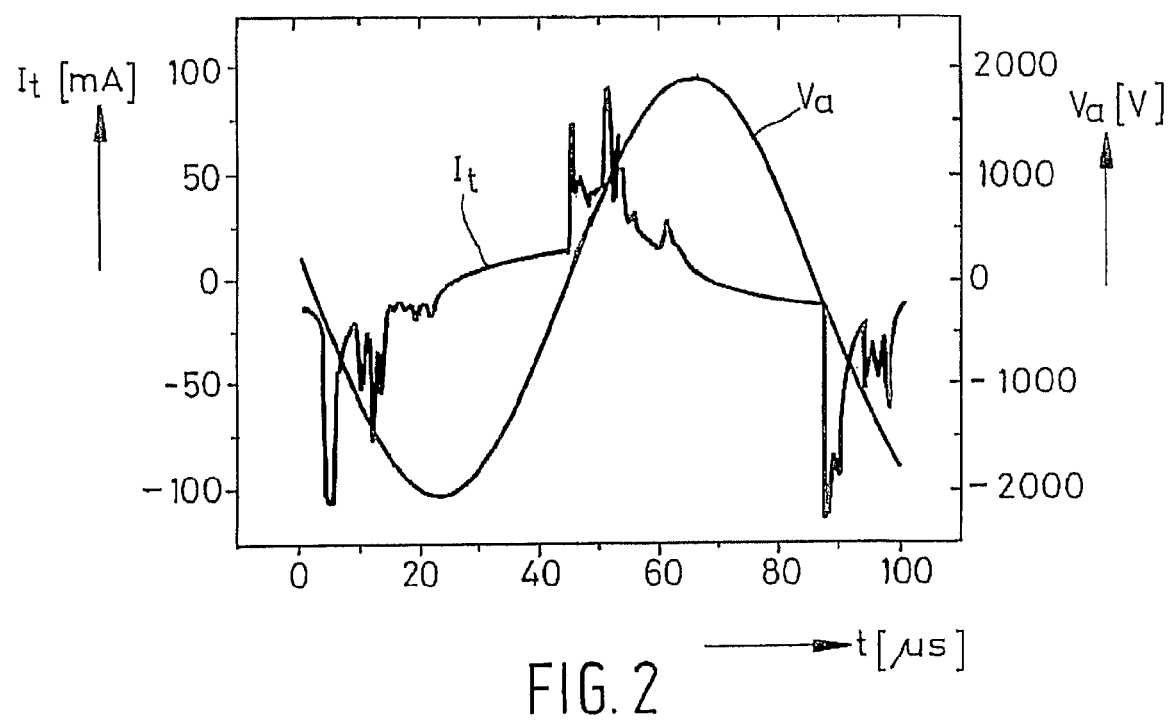
FIG. 2 shows a graph of the total current waveform and the energizing voltage waveform in the device of FIG. 1 in Argon, not using the present invention.

FIG. 2 shows graphically the results of the measured energizing voltage $V_a$ and the total current $I_t$ waveforms in an experimental set up, wherein a plasma is created in Argon in a plasma discharge space as schematically shown in FIG. 1. The electrode distance or spacing d=1 mm and the energizing voltage $V_a$ has a frequency of 11.8 kHz. Time t in microsecond is depicted running along the horizontal axis. On the left vertical axis of the graph, current values of $I_t$ in mA are indicated. On the right vertical axis of the graph voltage values of $V_a$ in V are shown.

As can be seen from FIG. 2, at plasma breakdown a number of current streamers is generated leading to an unwanted filamentary plasma.

Figure 3:
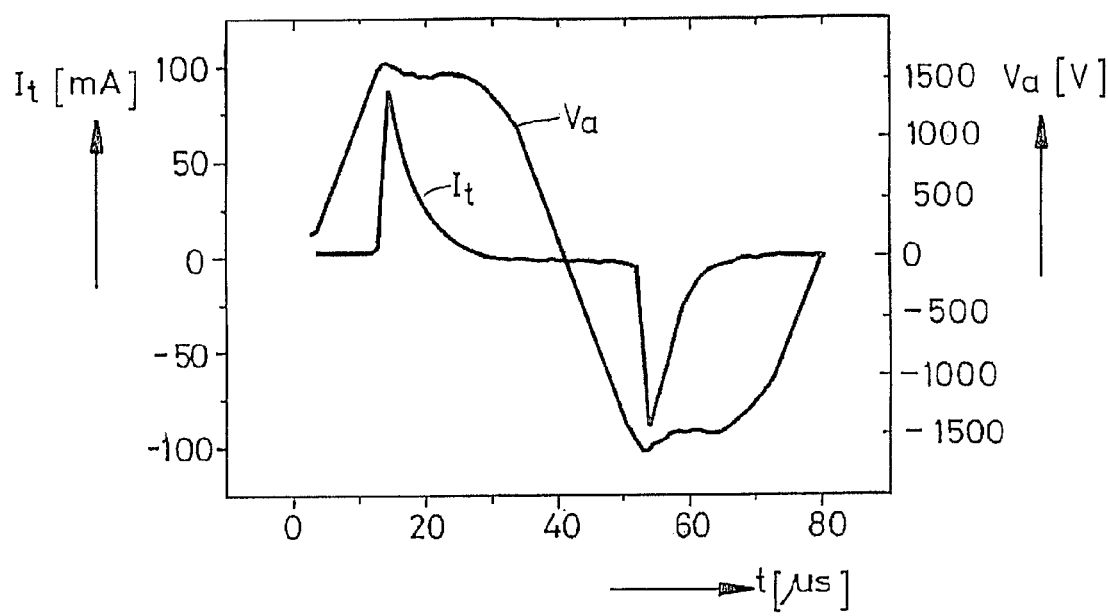
FIG. 3 shows a graph of the total current waveform and the energizing voltage waveform in the device of FIG. 1 in Argon, using the present invention.

FIG. 3 shows, similar to FIG. 2, graphically the results of the measured energizing voltage $V_a$ and the total current $I_t$ waveforms in an experimental set up wherein a plasma is created in Argon in a plasma discharge space as schematically shown in FIG. 1, however using the measures according to the present invention. The electrode distance or spacing d=1 mm and the energizing voltage $V_a$ has a frequency of 13 kHz.

As can be seen from FIG. 3, at plasma breakdown in the positive half cycle, that is at or already before the leading edge of the total current $I_t$, the energizing voltage $V_a$ is arranged to have its second derivative over time less than zero. As a result, no current streamers are generated and a more uniform and stable plasma is created. The plasma is preferably generated at a voltage which is a few percent higher than the minimum voltage for maintaining the plasma.

Figures 4, 5:
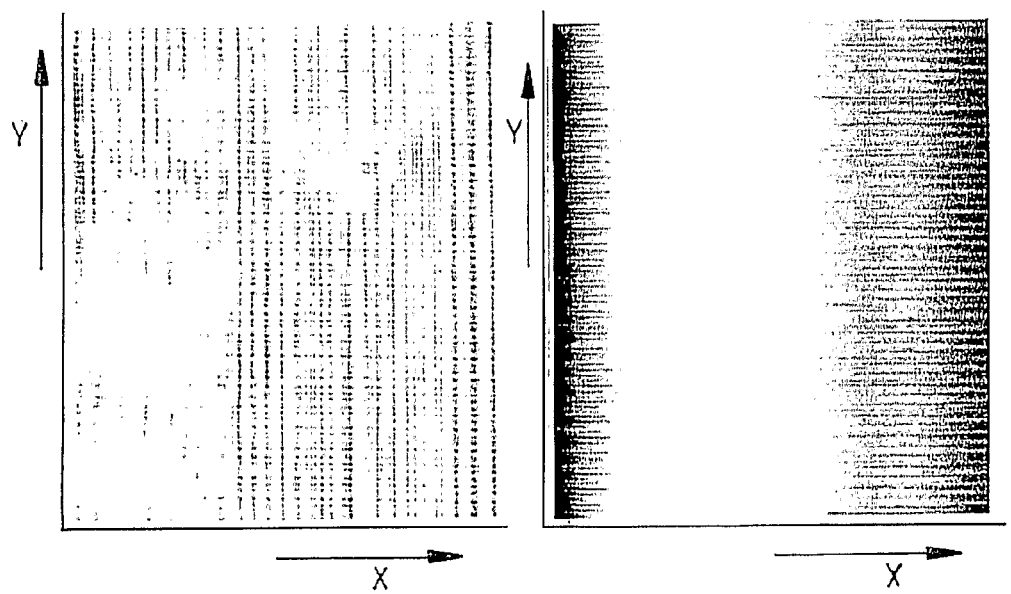
FIGS. 4 and 5 show fast camera images of surfaces treated in an APG plasma of FIGS. 2 and 3, respectively.
Figure 6:
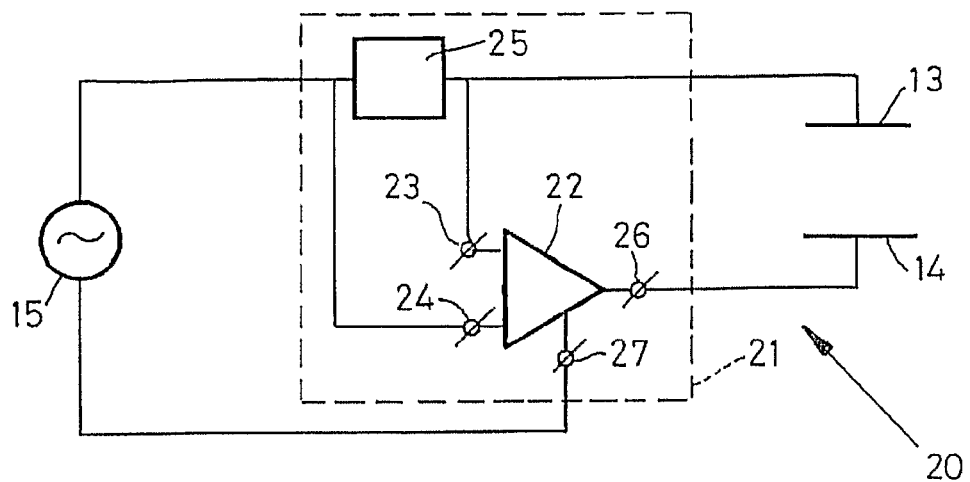
FIG. 6 shows, in a very schematic manner, an electric circuit diagram of an embodiment of the apparatus according to the present invention.

The improvement according to the present invention can be further illustrated from pictures taken with a fast image camera of a surface treated in the above-mentioned examples. FIG. 4 shows a surface treated in the set up as disclosed in connection with FIG. 2. FIG. 5 shows a surface treated in the set up as disclosed in connection with FIG. 3. In FIGS. 4 and 5, the vertical axis or direction as seen in the plane of the drawing, represents time frames of 30 microseconds and the horizontal axis or direction represents spatial homogeneities of the plasma. Due to the unwanted streamers, the surface of FIG. 2 is not evenly treated, which can be clearly seen from the randomly spread perturbations over the surface due to the filamentary discharge plasma generated. The surface shown in FIG. 5 is clearly more evenly treated. No perturbations are visible and due to a stable glow plasma generated.

In an embodiment of an apparatus 20 according to the invention, stabilization means 21 are provided in the form of a pulse generator, indicated in dashed lines, which generates voltage pulses to modify the voltage provided by the AC power supply means 15, such that at plasma generation the second derivative over time of the energizing voltage $V_a$ is less than zero. The amplitude of the voltage pulses of the pulse generator 21 is opposite to the AC powering voltage of the AC power supply means 15. The pulses generated by the pulse generator 21 may be suitably superimposed on the energizing voltage.

In an alternative embodiment, the stabilization means 21 comprise a pulse generator 22 the input or control terminals 23, 24 of which are connected to current sensing means 25 which connected in series with at least one of the electrodes 13 of the plasma discharge space and the AC power supply means 15, i.e. in the total current path. The output terminals 26, 27 of the pulse generator 22 are connected in series with the power supply means 15 and the electrode 14 of the plasma discharge space.

The pulse generator 22 is activated at plasma breakdown, which is sensed by the current sensing means 25. The current sensing means 25 may take several forms, such as but not limited to electronic components, inductor means and/or a small resistor. Breakdown of the plasma can be detected from saturation of inductor means such as a choke coil, for example.

The means 25 additionally may also be arranged, in accordance with a further embodiment of the invention, for providing the first derivative over time of the displacement current $dI_d/dt$. Means for this purpose may comprise, inter alia, suitably designed inductor means.

In a yet further embodiment of the invention, the means 25 may be arranged for providing the first derivative over time of the energizing voltage $dV_a/dt$. The pulse generator means 22, at plasma generation, are arranged for suddenly decreasing $dV_a/dt$, generating a large and negative second derivative over time of the energizing voltage. i.e. $d^2V_a/dt^2 << 0$.

Effective plasma stabilization is achieved if at plasma generation the second derivate of the voltage over time is negative, $d^2V_a dt^2 < 0$, and its absolute value is proportional to the first derivative over time of the displacement current $dI_d/dt$.

Pulse generator means 22 and means 25 for current sensing and/or for providing derivatives of electric quantities are known to the skilled person and, for the purpose of the present invention, need no detailed explanation here.

Figure 7:
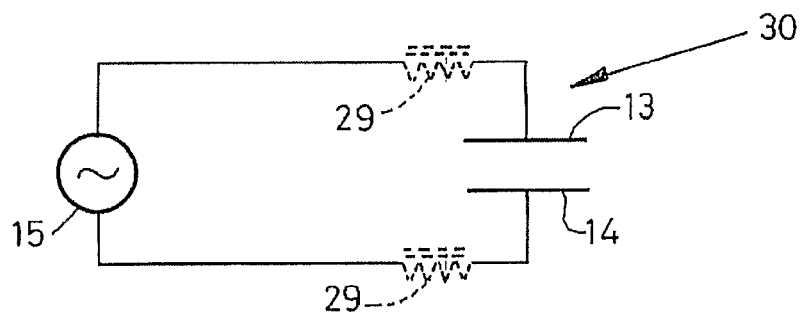
FIG. 7 shows, in a very schematic manner, an electric circuit diagram of a further embodiment of the apparatus according to the present invention.

FIG. 7 shows a simple embodiment of an apparatus 30 according to the invention, using inductor means 29 connected in series with the power supply means 15. The inductor means 29 may comprise suitably designed choke coil means or electronic inductor means. The inductor means are designed such to modify the supply voltage provided by the supply voltage means 15 to provide an energizing voltage $V_a$ at the electrodes 13, 14 having a second derivative over time less than zero.

Figure 8:
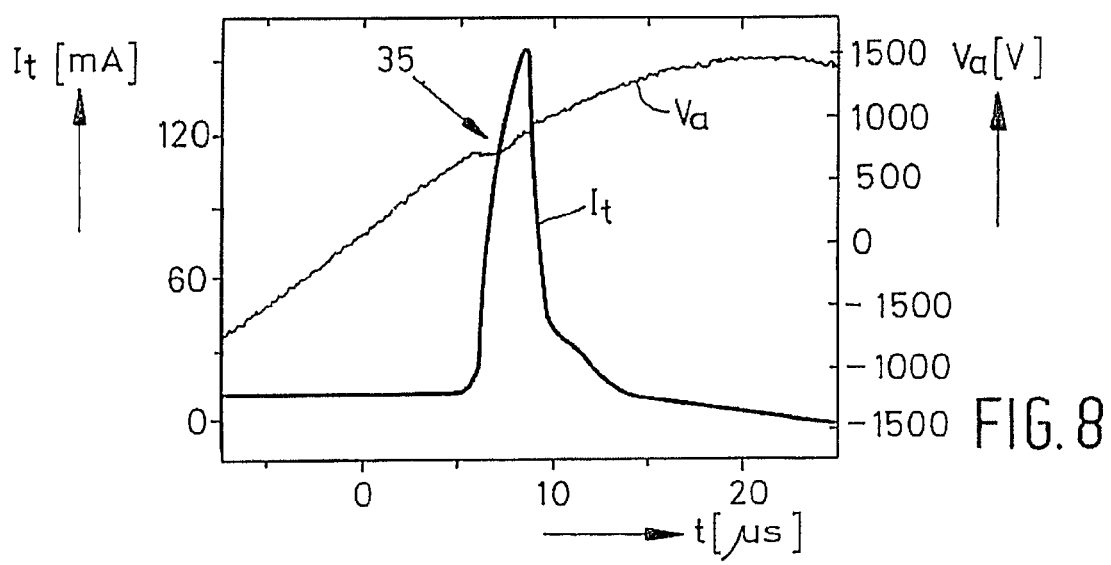
FIG. 8 shows a graph of part of the total current waveform and the energizing voltage waveform in the apparatus of FIG. 7.

FIG. 8 shows part of the measured energizing voltage $V_a$ and the total current $I_t$ waveforms in an experimental set up, using the apparatus shown in FIG. 7 with Ar gas and an electrode spacing of 1 mm.

As indicated by reference numeral 35, at the leading edge of the total current $I_t$, due to the operation of the inductor means 29, the energizing voltage $V_a$ shows a behavior equal to a voltage of which the second derivative over time is less than zero. As a result, a very stable plasma is generated, without streamers.

Figure 10:
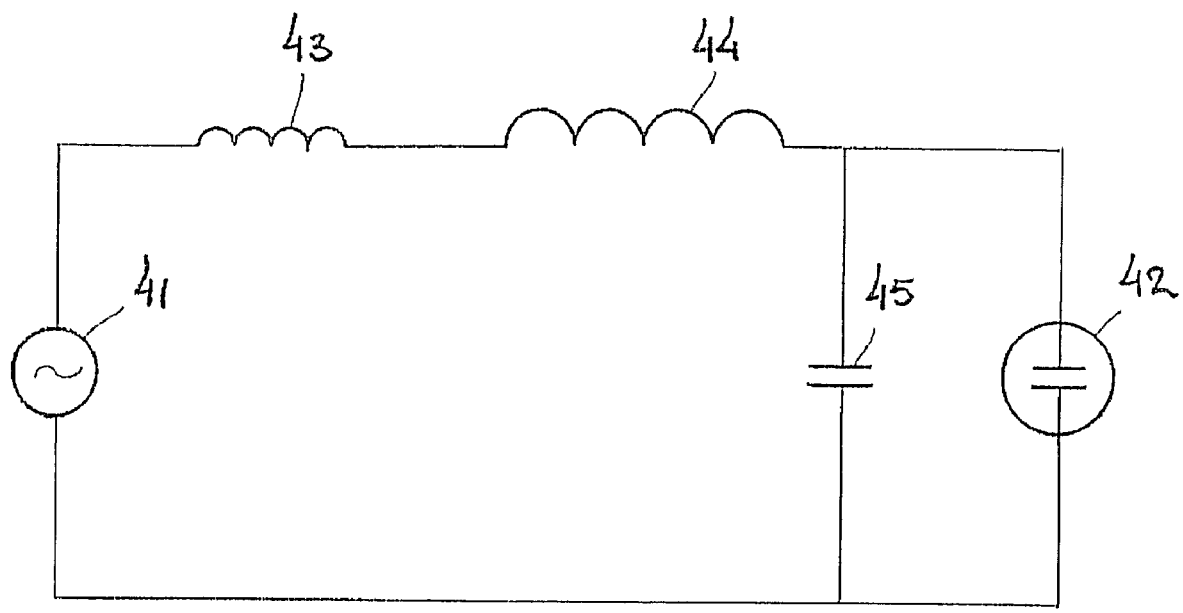
FIG. 10 is a schematic illustration of an electric circuit diagram of another embodiment arrangement according to an embodiment of the present invention.

FIG. 10 is a schematic illustration of an arrangement according to an embodiment of the present invention, wherein an AC power supply 41 is connected to an electrode configuration 42 forming a discharge space for generating an Atmospheric Pressure Glow (APG) plasma. In series with the electrode configuration 42, there is connected a non-linear electric circuit element in the form of a choke coil 43, which is operated in a saturated state at least during a plasma pulse generated using the AC power supply 41 and in particular in the period of the life cycle of the plasma after its pulse maximum, i.e. at or near the end of the pulse.

In series with the choke coil 43, in accordance with an embodiment of the invention, a further inductor or matching coil 44 is installed which is operated in an unsaturated state. The matching coil 44 is primarily used as phase shifting means, and may be suitably dimensioned for this purpose. In one embodiment, a matching coil having an inductance of 0.7 mH was used together with a ferrite choke coil 43 having an inductance between 0.1 and 0.2 mH. The ferrite used in this choke coil is a 3S4 ferrite (MnZn) with $\mu_r$=1700, Hc=20 A/m, Br=170 A/m and Bsat=350 A/m.

The matching coil 44 also provides a relative decrease of the displacement current in the early stage of the plasma pulse generated using the arrangement of FIG. 10. This is due to the fact that the matching coil will counteract the rapidly changing magnetic flux during plasma generation before the pulse maximum by responding with a relative decrease of the displacement current (Lenz law). Any instabilities in the plasma will be extinguished as a result of the decreasing displacement current, in accordance with the invention.

A capacitance 45 is parallel connected to the electrode configuration 42 for damping of harmonics. This capacitance 45 may be inherently formed by the stray capacitance of the electrode configuration 42, for example.

The effects of the choke coil 43 may be noted best if the saturation current of the choke coil 43 is at least smaller than the displacement current of the circuit of FIG. 10 without a choke coil 43, which is equal to:

$$I_{d,\ without\_choke} = \omega C V_{max} \qquad (2)$$

wherein:
$\omega$=fundamental angular frequency of the AC energizing voltage,
C=capacity of the APG electrode configuration, and
$V_{max}$=amplitude of the AC energizing voltage.

Preferably, the saturation current of the choke coil used is larger than 50% of the displacement current.

Figure 11:
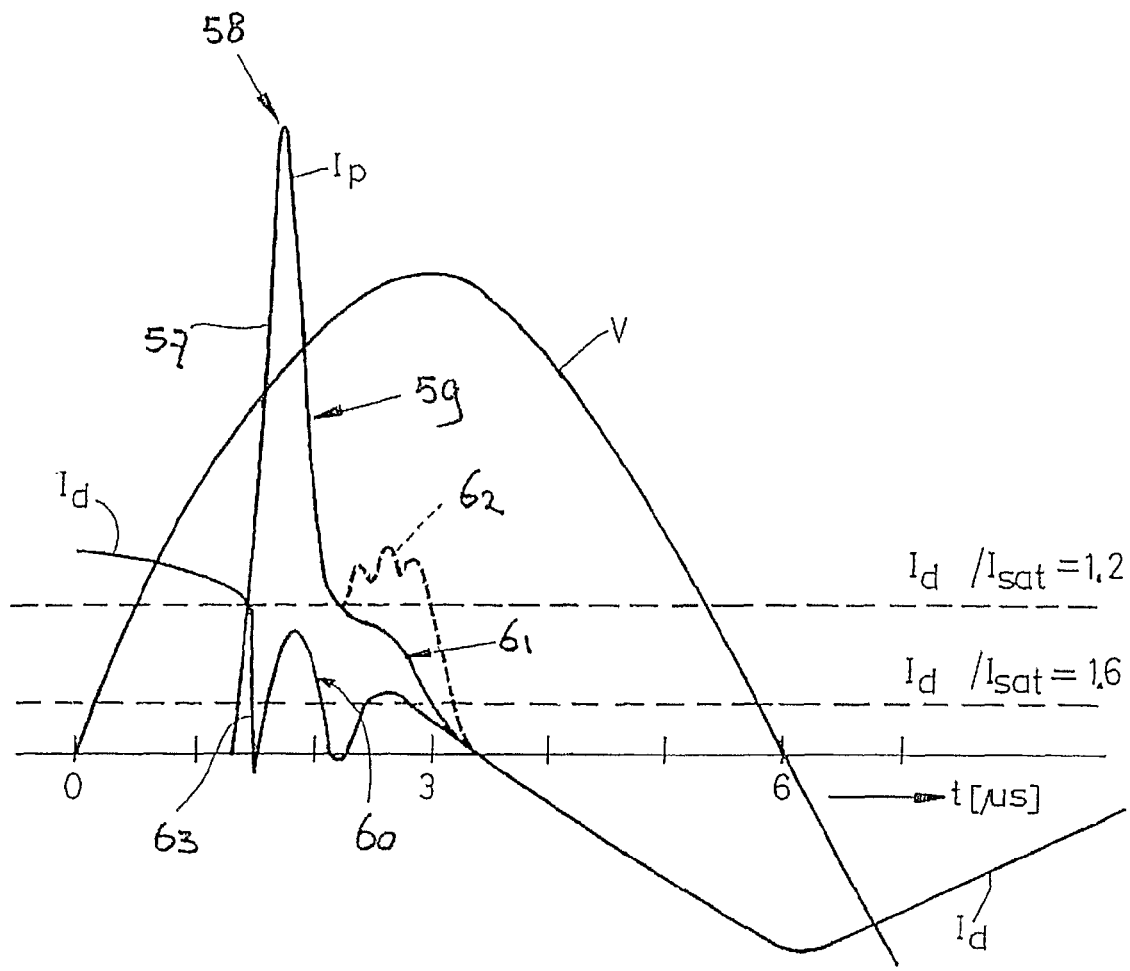
FIG. 11 shows the AC energizing voltage, the plasma current and the displacement current of a plasma generated using the embodiment of FIG. 10 of the present invention.

FIG. 11 shows a graph of the energizing voltage V, the plasma current $I_p$ and the displacement current $I_d$ over time t, in an embodiment of the method of the present invention with the arrangement shown in FIG. 10. For illustrative purposes, only the positive first halve of the energizing voltage V is shown. A plasma was generated according to the invention under the following conditions: An LC series network at 240 kHz was used with a resonance or matching coil 44 having an inductance of 2 mH, an APG electrode capacitance 45 of 140 pF, a choke coil 43 having an inductance of 0.7 mH, and with $I_d/I_{sat}$=1.4. The gas used was Ar+20% air at atmospheric pressure. To prevent the risk of sparking and for matching reasons a pulsed plasma with a duty cycle of 10% was used.

It can be seen that a plasma pulse 57 is generated having an absolute pulse maximum 58. After the pulse maximum 58, i.e. between time t of approximately 2 and 3 μS, the plasma current $I_p$ decreases, showing a negative slope 59. In accordance with the present invention, in relation to the decrease 59 of the plasma current $I_p$, a relative decrease 60 of the displacement current $I_d$ occurs, caused by the saturated choke 43. As a result, the plasma current $I_p$ shows a relatively clean downward slope 61, without sharp peaks or spikes generated by plasma filaments, providing a stable glow plasma as intended. For illustrative purposes, the broken line 62 illustrates the plasma current $I_p$ in accordance with the prior art, i.e. without the teachings of the invention. One can observe a very irregular current waveform 62, causing unwanted streamers and the like in the plasma.

From FIG. 11 it can be further seen that in the time period at least from just before the plasma breakdown until during the plasma pulse 57 after the pulse maximum 58, the ratio between the displacement current $I_d$ and the saturation current $I_{sat}$ of the choke coil 43 is comprised in a range between 1.2 and 1.6. With this ratio, the displacement current $I_d$ has a substantially triangular shape, except for the regions where the plasma is generated, and shows a relative decrease during the whole of the period from before the start of the plasma pulse 57, after the pulse maximum 58, until the plasma is fully extinguished. This triangular wave form is very beneficial for obtaining a stable plasma breakdown. In general, the stability of the plasma is enhanced by steepening the slope of the displacement current, i.e. $dI_d/dt$.

From FIG. 11 it can also be observed that at the generation of the plasma pulse 57, that is before the pulse maximum 58 the displacement current $I_d$ at first drops considerably, i.e. between time t of approximately 1 and 2 μs, indicated by reference numeral 63. This drop 63 of the displacement current $I_d$ is caused by the (unsaturated) matching coil 44. Accordingly, in an arrangement of the invention as illustratively shown in FIG. 10, amongst others, by properly selecting the choke coil such that ratio between the displacement current $I_d$ and the saturation current $I_{sat}$ of the choke coil 43 is comprised in a range between 1.0 and 3, and preferably between 1.2 and 1.6, in combination with an (unsaturated) matching coil, a sharp relative decrease of the displacement current $I_d$ at the generation of the plasma pulse 57 can be obtained, enhancing and sustaining the generation of a stable glow plasma.

It has been observed that by increasing the ratio between the displacement current $I_d$ and the saturation current $I_{sat}$ of the choke coil 43 beyond 1.6, the voltage over the APG electrodes will show a more rectangular shaped waveform.

From FIG. 11 it will be clear that the relative decrease of the displacement current according to the invention and described above is provided in fractions of a microsecond.

Those skilled in the art will appreciate that similar waveforms of opposite sign will occur at the negative halve period of the energizing voltage V.

Although in the above oppositely positioned electrodes have been discussed and shown in the relevant figures, the invention may also be practiced with adjacently arranged electrode pairs or other configurations of electrodes of an APG apparatus.

Those skilled in the art will appreciate that many modifications and additions can be made without departing from the novel and inventive scope of the invention as defined in the appending claims.

The invention claimed is:

1. Method for controlling a glow discharge plasma in a gas or gas mixture under atmospheric conditions, in a plasma discharge space comprising at least two spaced electrodes, wherein at least one plasma pulse is generated by an AC plasma energizing voltage to said electrodes causing a plasma current and a displacement current, said at least one plasma pulse comprising an absolute pulse maximum, said method comprises the step of controlling said energizing voltage such that a relative decrease of said displacement current is provided before said pulse maximum.

2. Method according to claim 1, further comprising a step of synchronizing said relative decrease of said displacement current with the onset of said plasma pulse.

3. Method according to claim 1, wherein said relative decrease of said displacement current is provided within a time interval, wherein said time interval is of an order of a microsecond, preferably fractions of a microsecond.

4. Method according to claim 3, wherein said relative decrease of said displacement current within said time interval is at least 100%.

5. Method according to claim 1, wherein said relative decrease of said displacement current results in a relative negative value for said displacement current.

6. Method according to claim 1, wherein before said pulse maximum said energizing voltage is controlled in a manner such that a second derivate of said energizing voltage over time is proportional and of opposite sign to a first derivative over time of plasma current.

7. Method according to claim 1, wherein at least one of said electrodes is covered by a dielectric material.

8. Method according to claim 7, wherein said dielectric material has a secondary electron emission between 0.01 and 1.

9. Method according to claim 1, wherein said plasma is operated at a voltage that is a few percent higher than the minimum voltage necessary for maintaining said plasma.

10. Apparatus for controlling a glow discharge plasma in a discharge space having at least two spaced electrodes, means for introducing in said discharge space a gas or gas mixture under atmospheric conditions, a power supply for energizing said electrodes by applying an AC plasma energizing voltage to said electrodes for generating at least one plasma pulse and causing a plasma current and a displacement current, said at least one plasma pulse comprising an absolute pulse maximum, and means for controlling said plasma, said means for controlling said plasma are arranged for controlling said energizing voltage such that a relative decrease of said displacement current is provided before said pulse maximum.

11. Apparatus according to claim 10, further comprising means for synchronizing said relative decrease of said displacement current with the onset of said plasma pulse.

12. Apparatus according to claim 10, wherein at plasma generation said means for controlling said plasma are arranged for decreasing said displacement current to a value relatively less than a value of said displacement current before plasma breakdown.

13. Apparatus according to claim 10, wherein said means for controlling said plasma are arranged for controlling said energizing voltage in a manner such that at plasma generation said relative decrease of said displacement current is at least 100% and is provided in fractions of a microsecond.

14. Apparatus according to claim 10, wherein said means for controlling said plasma are arranged for providing a first derivative over time of an absolute value of said energizing voltage and for sharply decreasing said first derivative over time of said absolute value of said energizing voltage at plasma generation.

15. Apparatus according to claim 10, wherein said means for controlling said plasma are arranged for controlling said energizing voltage in a manner such that, before said pulse maximum, a second derivate of said energizing voltage over time is proportional and of opposite sign to a first derivative over time of plasma current.

16. Apparatus according to claim 15, wherein said first derivative of said plasma current is provided by inductor means connected in series with said electrode or electrodes of said discharge space.

17. Apparatus according to claim 10, wherein said means for controlling said plasma comprise pulse generator means providing voltage pulses superimposed at said energizing voltage at said electrodes.

18. Apparatus according to claim 17, wherein said pulse generator is formed by a power amplifier, having input or control terminals which are connected to means for sensing plasma current, and wherein output terminals of said amplifier are connected in series with said power supply means and said electrodes for superimposing a voltage pulse at said energizing voltage.

19. Apparatus according to claim 10, wherein said means for controlling said plasma comprise electronic inductor circuitry.

20. Apparatus according to claim 10, wherein said electrodes are spaced over a distance of between 0.01 mm and 3 cm.

21. Apparatus according to claim 10, wherein said gas is selected from a group comprising Helium, Argon, Nitrogen, Air, Oxygen, Carbon Dioxide, Ammonia and a mixture comprising any of said gasses of said group.

22. Apparatus according to claim 10, wherein said gas is a mixture of a noble gas and a chemically active gas.

23. Apparatus according to claim 10, wherein said AC power supply means are arranged for energizing said electrodes with an energizing voltage at a frequency between 10 kHz and 50 MHz.

24. Device for treating a surface of a substrate, comprising an apparatus for controlling a glow discharge plasma in a discharge space having at least two spaced electrodes, means for introducing in said discharge space a gas or gas mixture under atmospheric conditions, a power supply for energizing said electrodes by applying an AC plasma energizing voltage to said electrodes for generating at least one plasma pulse and causing a plasma current and a displacement current, said at least one plasma pulse comprising an absolute pulse maximum, and means for controlling said plasma, said means for controlling said plasma are arranged for controlling said energizing voltage such that a relative decrease of said displacement current is provided before said pulse maximum.

* * * * *